(12) United States Patent
Chang (10) Patent No.: US 7,312,996 B2
(45) Date of Patent: Dec. 25, 2007

(54) HEAT SINK FOR MEMORY STRIPS

(76) Inventor: Wan Chien Chang, 235 Chung-Ho Box 8-24, Taipei (TW)

( * ) Notice: Subject to any disclaimer, the term of this patent is extended or adjusted under 35 U.S.C. 154(b) by 252 days.

(21) Appl. No.: 11/079,502

(22) Filed: Mar. 14, 2005

(65) Prior Publication Data

US 2006/0203454 A1 Sep. 14, 2006

(51) Int. Cl.
*H05K 7/20* (2006.01)
*F28F 7/00* (2006.01)
*H01L 23/34* (2006.01)

(52) U.S. Cl. ............... 361/704; 165/80.3; 165/185; 361/707; 361/708; 361/710; 361/715; 257/719

(58) Field of Classification Search ............... 361/715
See application file for complete search history.

(56) References Cited

U.S. PATENT DOCUMENTS

| | | | | |
|---|---|---|---|---|
| 6,535,387 B2* | 3/2003 | Summers et al. | ............ | 361/704 |
| 6,775,139 B2* | 8/2004 | Hsueh | ............ | 361/697 |
| 7,023,700 B2* | 4/2006 | Chiou et al. | ............ | 361/704 |
| 7,079,396 B2* | 7/2006 | Gates et al. | ............ | 361/719 |
| 2006/0056160 A1* | 3/2006 | Tsai | ............ | 361/715 |

* cited by examiner

*Primary Examiner*—Gregory D Thompson (57) ABSTRACT

A heat sink for memory strips comprises two heat transfer plates respectively attached on two sides of a memory strip. The upper edges of the heat transfer plates are further provided with retaining tongues and retaining rings. The extended portion of the combined heat transfer plated above the memory strip forms a heat radiating section which further includes a multitude of radiating fins for enhancing the cooling effect.

7 Claims, 11 Drawing Sheets

HEAT SINK FOR MEMORY STRIPS

FIELD OF THE INVENTION

The present invention relates to heat sinks for memory strips, and more particularly to a heat sink for memory strips attached on two lateral walls of a memory strip for a better cooling effect.

BACKGROUND OF THE INVENTION

To achieve an effect of fast cooling, two metallic plates sandwiching a memory strip are commonly used as a heat sink to transfer the heat produced in the memory strip away and thereby reduce the likelihood of memory malfunction. However, due to the upgrade of computing speed of modern computers, the heat generating rate in a memory strip increases accordingly, and therefore an improvement of the structure of the associated heat sink is necessary.

SUMMARY OF THE INVENTION

Accordingly, the primary objective of the present invention is to provide a heat sink for memory strips in which the heat transfer plates thereof are extended upward to form a heat radiating section above the memory strip, thereby enhancing the cooling effect so as to accommodate the substantial heat generation of high speed memory chips.

The secondary objective of the present invention is to provide a heat sink for memory strips in which the heat radiating section above the memory trip is provided with a multitude of fins, whereby the contact area of the heat radiating section with the air is significantly increased.

It is a further objective of the present invention that the geometry of the fins on the heat radiating section of the heat sink is selected from rectangular plate, arc sheet and multi-sectional sheet.

Further, an additional advantage of the present invention is that the heat radiating section and the heat transfer plates of the heat sink can be different parts on an integral body or independent pieces to be connected together.

The various objects and advantages of the present invention will be more readily understood from the following detailed description when read in conjunction with the appended drawings.

BRIEF DESCRIPTION OF THE DRAWINGS

FIG. 5A is the cross-sectional view of the heat sink for memory strips in FIG. 5 along the dash line labeled by 5A.

FIG. 7A is the cross-sectional view of the heat sink for memory strips in FIG. 7 along the dash line labeled by 7A.

DETAILED DESCRIPTION OF THE PREFERRED EMBODIMENTS

Figure 1:
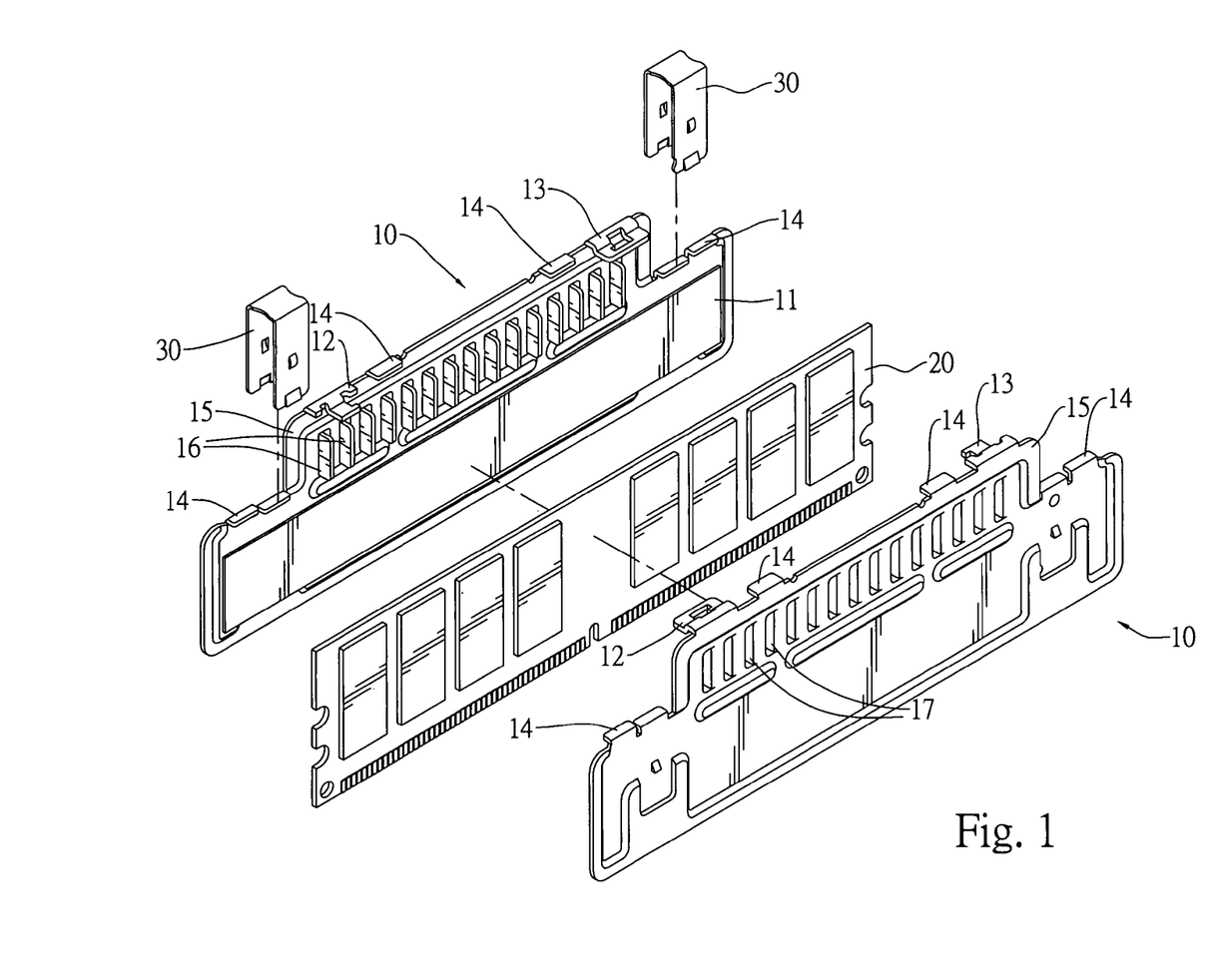
FIG. 1 is an exploded perspective view of a heat sink for memory strips according to the present invention.
Figure 2:
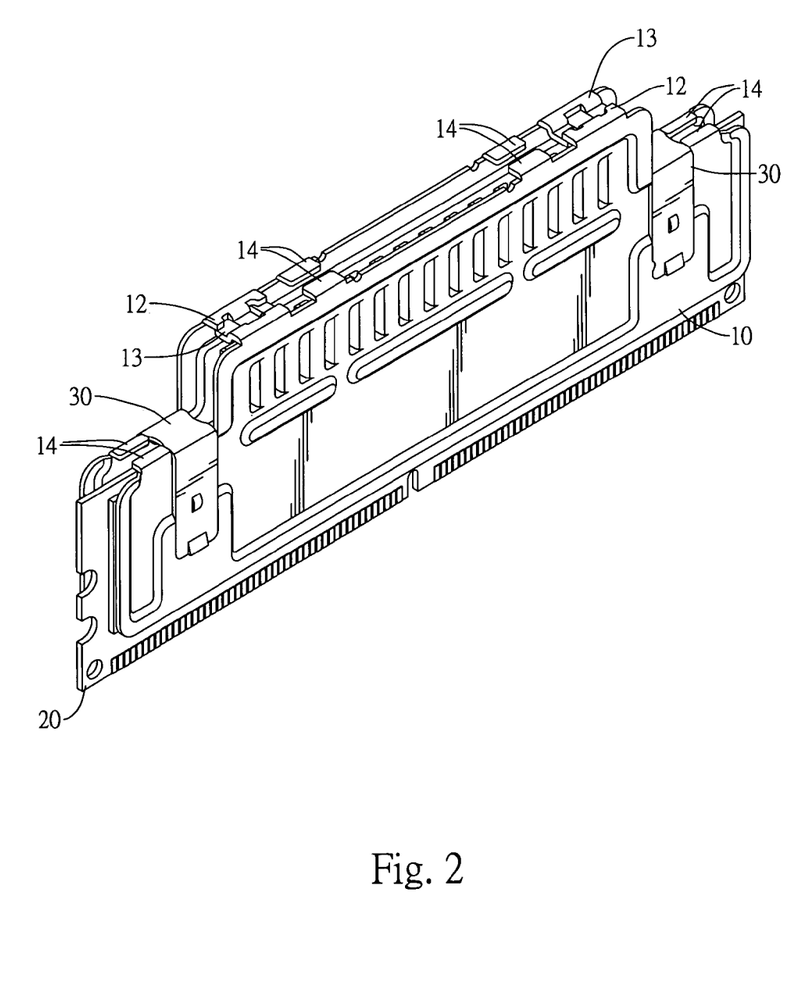
FIG. 2 is a perspective view of the heat sink for memory strips in FIG. 1.
Figure 3:
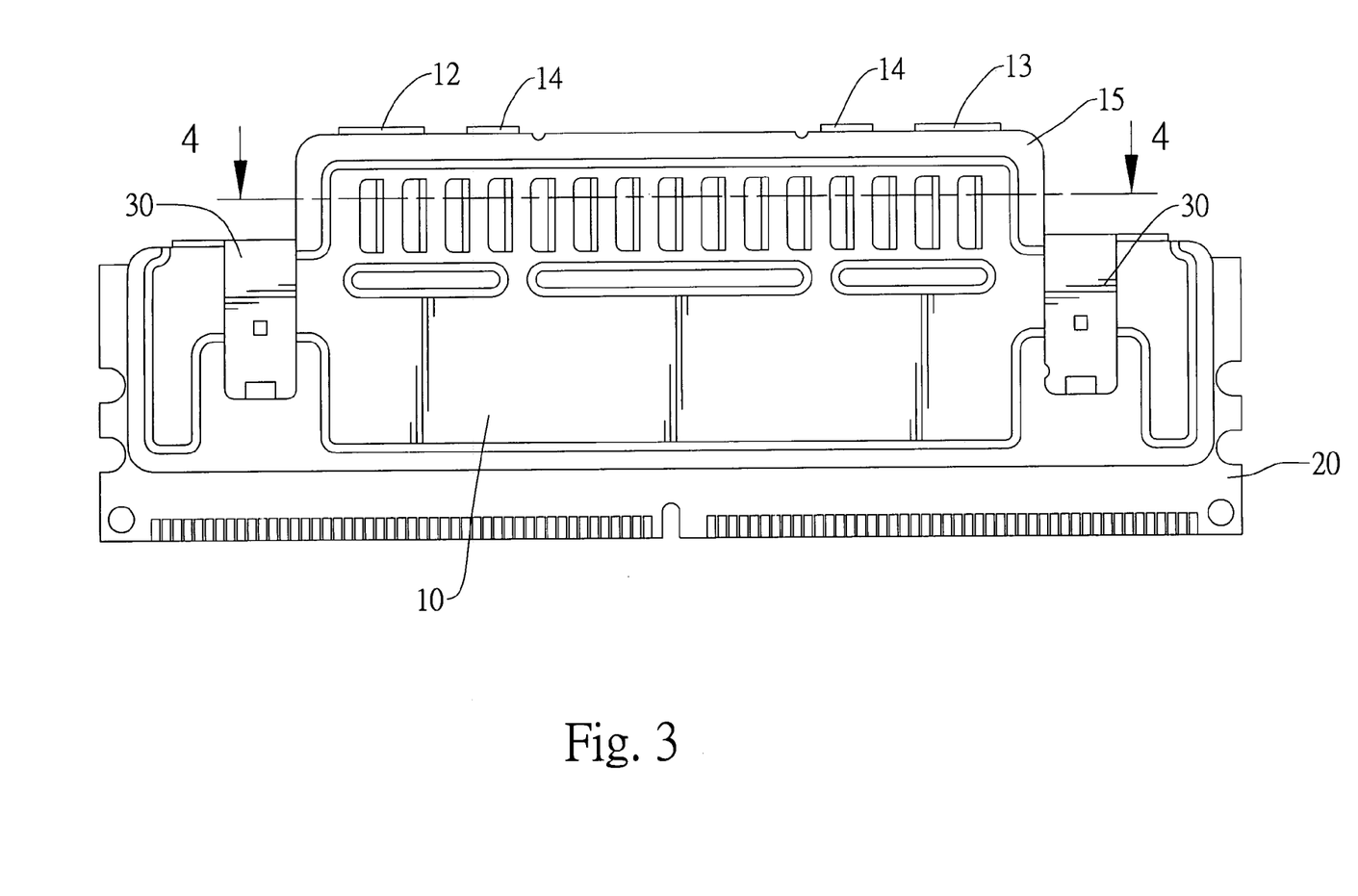
FIG. 3 is a side view of the heat sink for memory strips in FIG. 1.

Referring to FIG. 1, a heat sink for memory strips according to the present invention mainly comprises a pair of heat transfer plates 10 symmetrical about a memory strip 20. The inner wall 11 of each of the heat transfer plates 10 is further provided with a shock-absorbing material of high thermal conductivity for protecting the chips on the memory strip 20. The upper portions of the heat transfer plates 10 are respectively provided with retaining tongues 12 and retaining rings 13 capable of being mutually engaged. The upper edges of the heat transfer plates 10 further include flanges 14 for preventing the engaged retaining tongues 12 and retaining rings 13 from falling apart. Further, a pair of clamps 30 is used to retain the heat transfer plates 10 from their outer walls to reinforce the attachment of the heat transfer plates 10 to the memory strip 20.

The upper edges of the middle sections of the heat transfer plates 10 are extended above the memory strip 20 to form a heat radiating section 15; the heat radiating section 15 are provided with a multitude of radiating fins 16 for enhancing the cooling effect of the heat sink.

Figure 4:
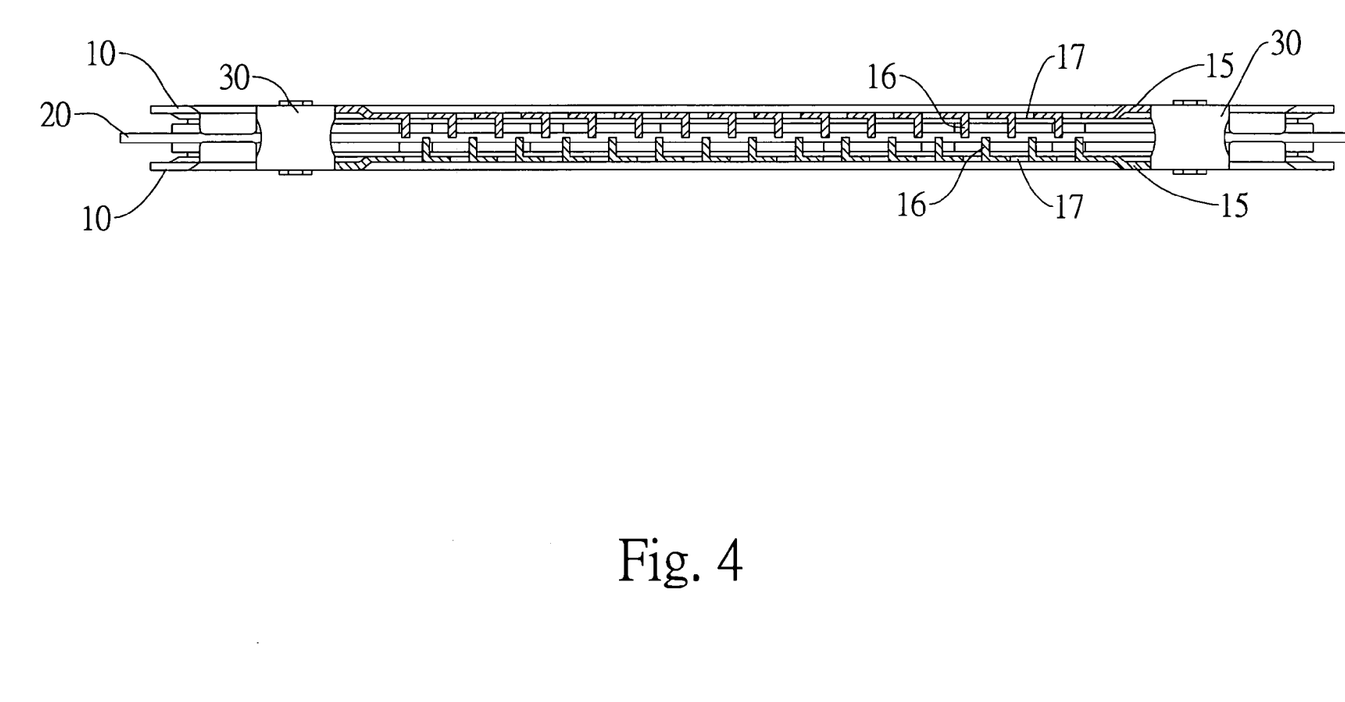
FIG. 4 is the cross-sectional view of the heat sink for memory strips in FIG. 3 along the dash line labeled by 4.

The preferred embodiment shown in FIG. 1 has rectangular radiating fins 16 formed directly on the heat radiating section 15 by punching, therefore producing a multitude of corresponding slots 17. Referring to FIG. 4, the radiating fins 16 enlarge the surface area of the air passage through two lateral sides of the heat radiating section 15, thereby enhancing the heat radiating effect.

Figure 5:
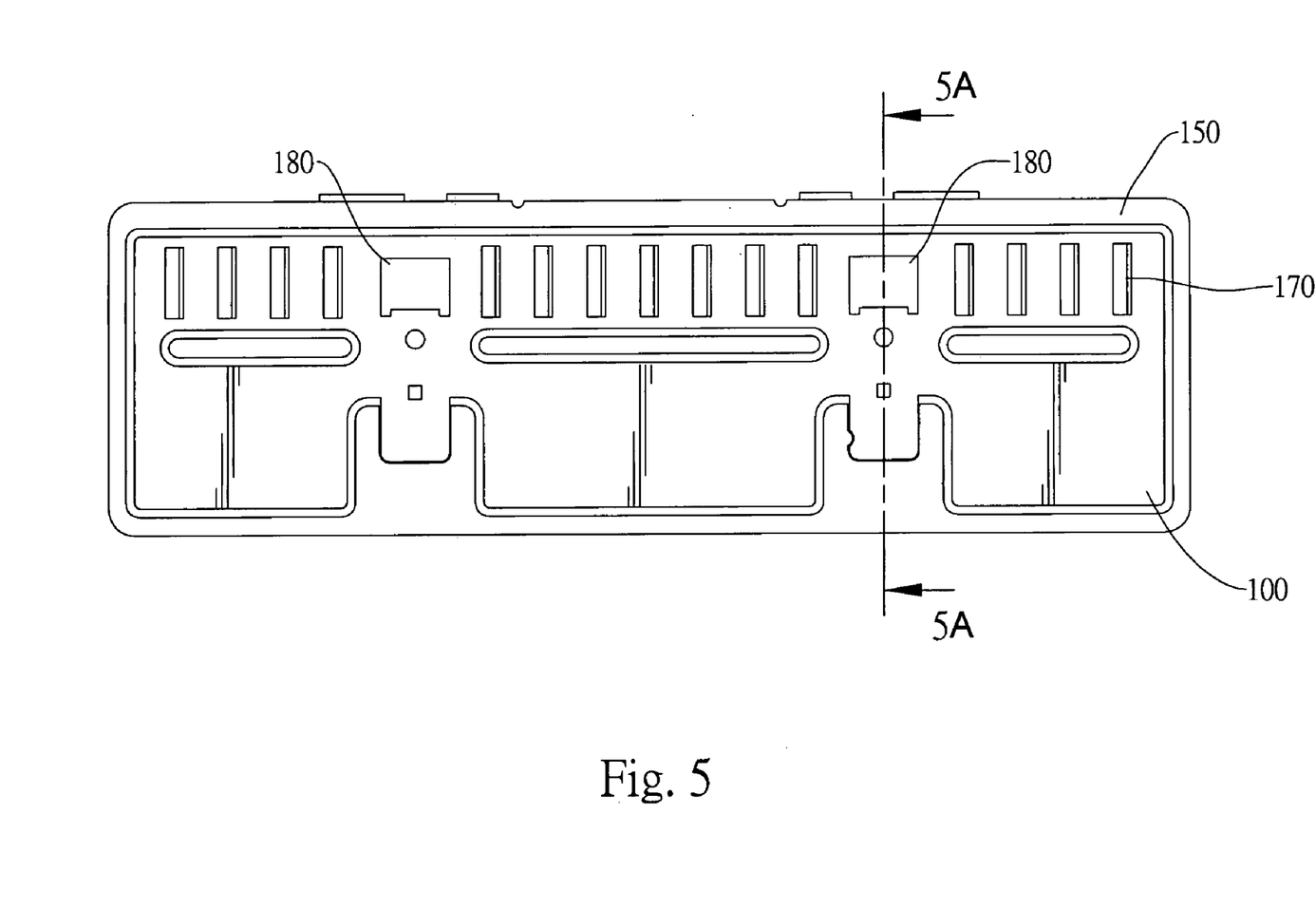
FIG. 5 is a side view of the second preferred embodiment of the present invention as a heat sink for memory strips.

Referring to FIGS. 5 and 5A, the second preferred embodiment of the present invention has a heat radiating section 150 extended from full upper edges of the heat transfer plates 100 and is therefore larger than that of the first preferred embodiment. To accommodate the installation of the clamps 30, a square hole 180 is formed on either side of the heat radiating section 150. Similarly, the heat radiating section 150 is provided with a multitude of radiating fins 160 and the corresponding slots 170. Therefore, this preferred embodiment has a larger heat radiating area than that of the first preferred embodiment.

Figure 6:
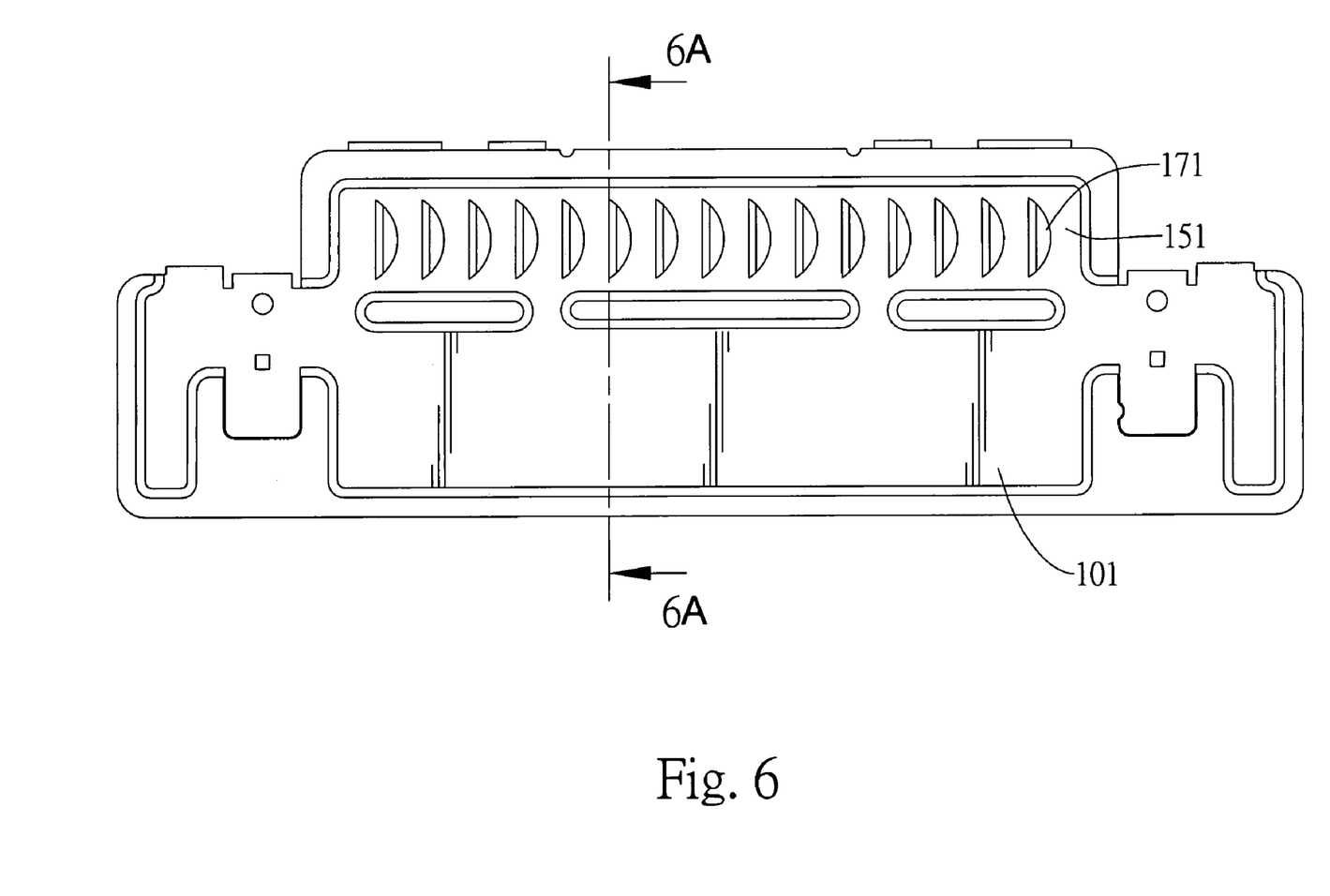
FIG. 6 is a side view of the third preferred embodiment of the present invention as a heat sink for memory strips.

Referring to FIG. 6 the third preferred embodiment of the present invention has a heat radiating section 151 extended from the heat transfer plates 101. Such a design has the advantage of forming smoother streamlines in the passing air, whereby the efficiency of heat radiation will increase.

Figure 7:
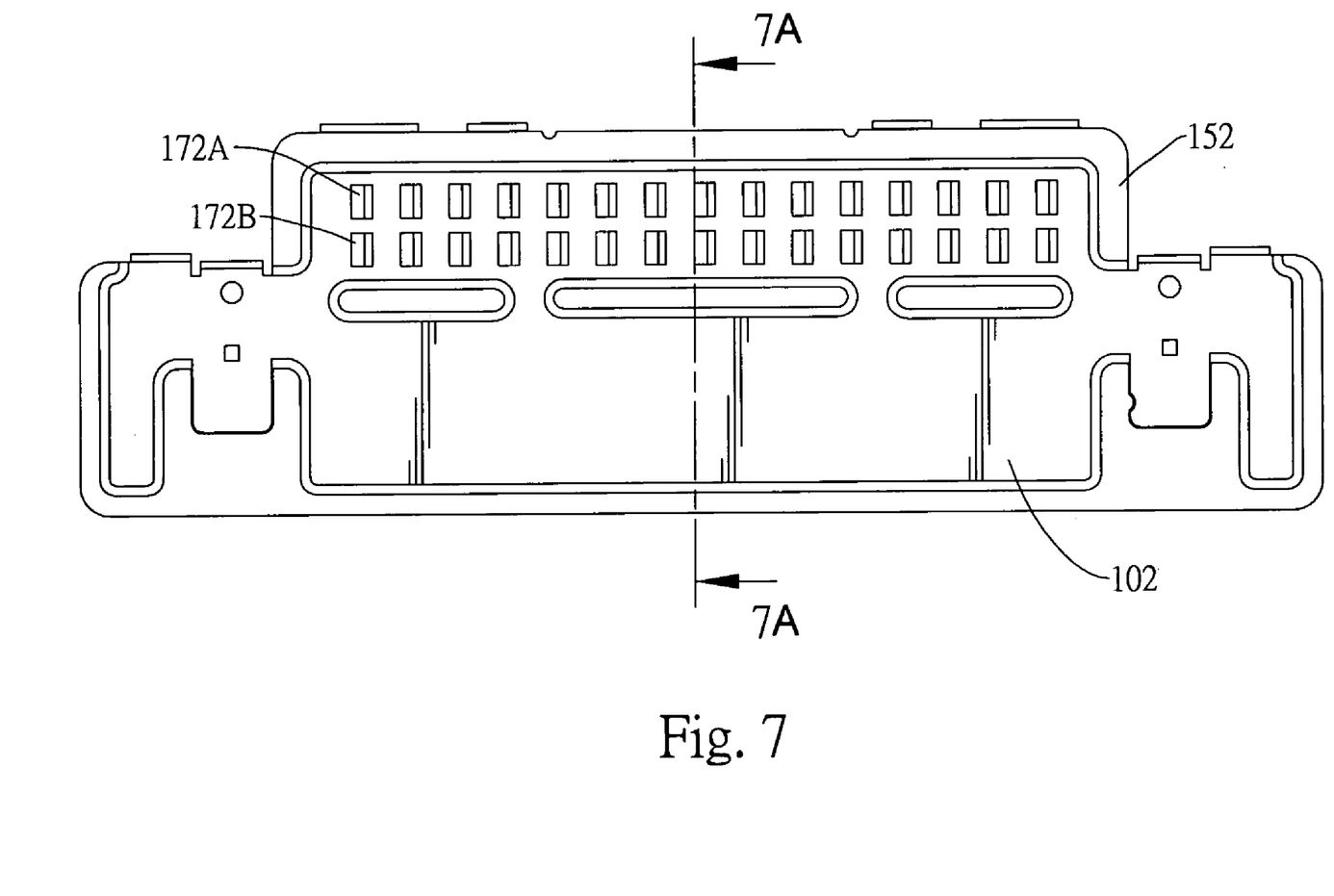
FIG. 7 is a side view of the fourth preferred embodiment of the present invention as a heat sink for memory strips.

Referring to FIGS. 7 and 7A, the fourth preferred embodiment of the present invention has a heat radiating section 152 extended from the heat transfer plates 102, on which two longitudinal rows of radiating fins 162A, 162B and corresponding slots 172A, 172B are formed so as to achieve a plurality of air passages for more efficient hear radiation. The number of rows can be larger than two, or the heat radiating section can even have an array of pointed projections in replacement of the fins.

Figure 8:
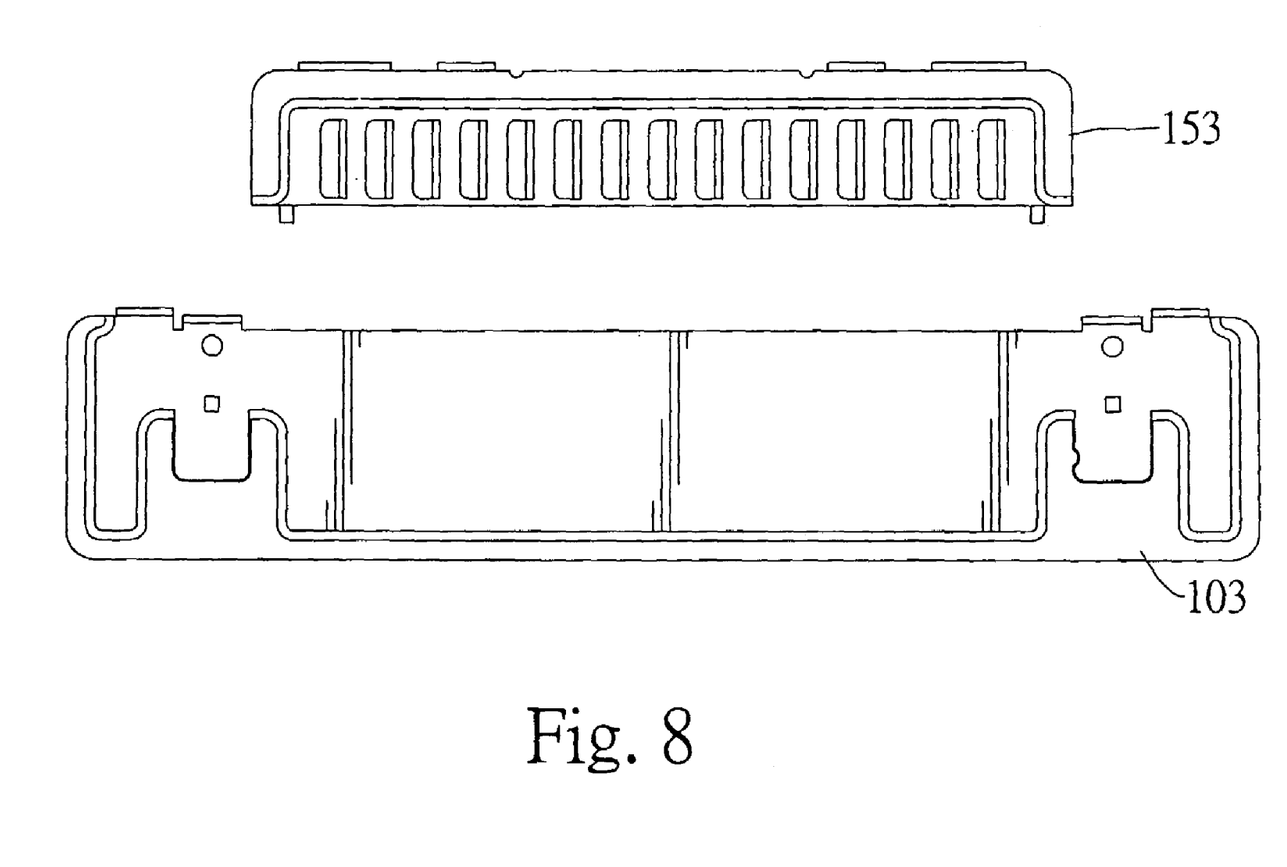
FIG. 8 is a side view of the fifth preferred embodiment of the present invention as a heat sink for memory strips in a separate configuration.
Figure 9:
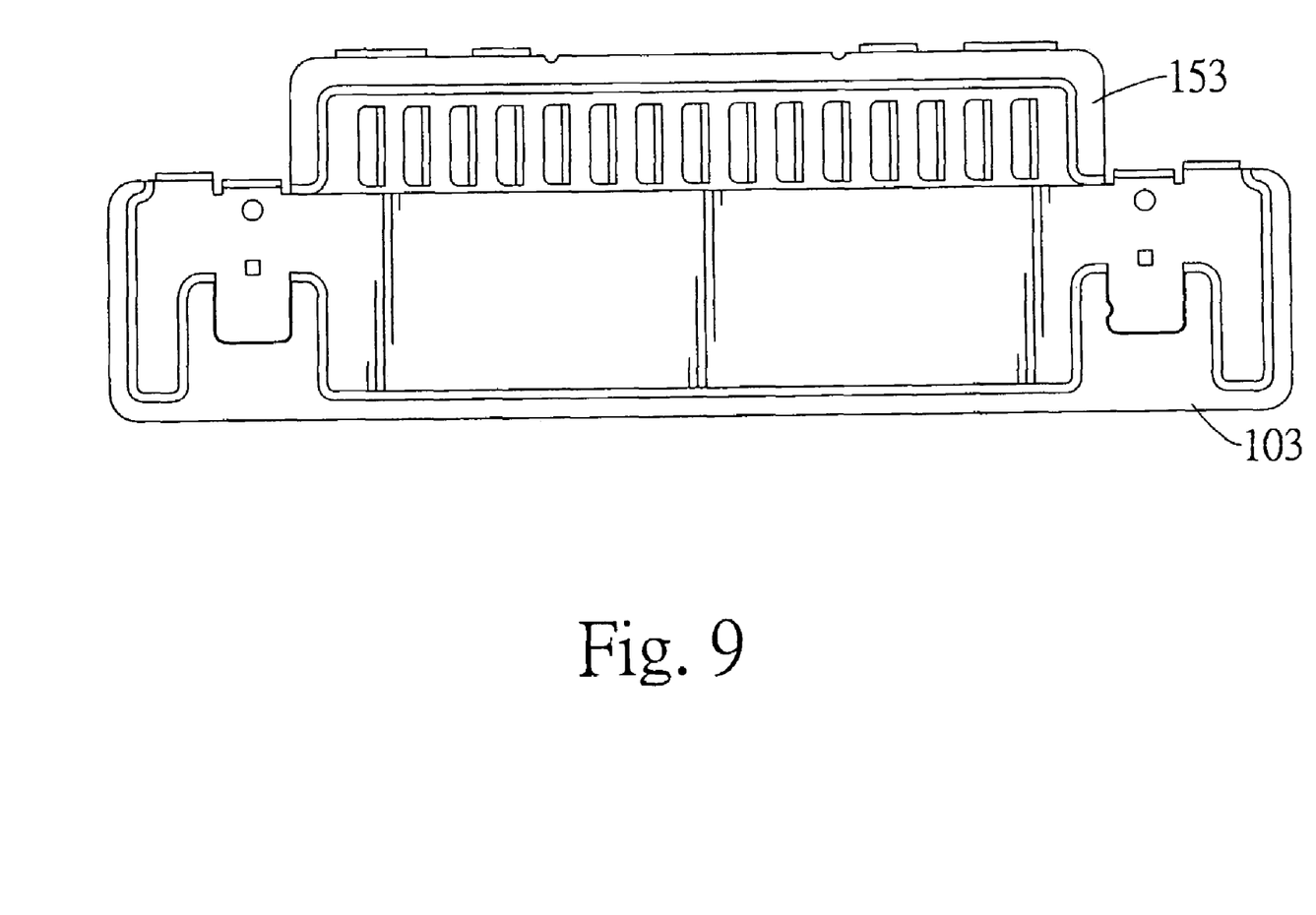
FIG. 9 is a side view of the fifth preferred embodiment of the present invention in a combined configuration.

Referring to FIGS. 8 and 9, the heat transfer plate 103 and the heat radiating section 153 of the fifth preferred embodiment of the present invention are separate parts. They can be connected by a connecting means such as welding or rivet jointing. The advantage of this preferred embodiment is that the heat radiating section 153 can be selected from a variety of sizes to fit various requirement of the installation space of the associated memory strip 20.

The present invention is thus described, and it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A heat sink for memory strips, comprising:
   a pair of heat transfer plates symmetrical about a memory strip, said heat transfer plates sandwiching said memory strip for transferring away heat produced within a plurality of chips on said memory strip; and
   a heat radiating section extended above said memory strip from a central section of upper edges of said heat transfer plates for enhancing an effect of heat radiation; and
   wherein said heat radiating section further includes a multitude of radiating fins for increasing the length of air passages; and
   wherein said radiating fins are inwardly extended from two opposite inner walls of said heat radiating section by punching.

2. The heat sink for memory strips of claim 1 wherein said upper edges of said heat transfer plates are further provided with retaining tongues and corresponding retaining rings for jointing said heat transfer plates and said memory strip together.

3. The heat sink for memory strips of claim 2 wherein said upper edges of said heat transfer plates are further provided with flanges for preventing said retaining tongues and said retaining rings from falling apart.

4. The heat sink for memory strips of claim 1 wherein a pair of clamps is further provided to enhancing the attachment of said heat transfer plates to said memory strip.

5. The heat sink for memory strips of claim 1 wherein an inner wall of each of said heat transfer plates is provided with a shock-absorbing material of high thermal conductivity for enhancing the attachment of said heat transfer plates to said memory strip and the protection of said memory strip.

6. The heat sink for memory strips of claim 4, wherein said heat radiating section is extended fully along said upper edges of said heat transfer plates, said heat radiating section being provided with two square holes respectively thereon for the insertion of said clamps.

7. The heat sink for memory strips of claim 1, wherein said heat transfer plates and said heat radiating section are separate parts capable of being jointed together.

* * * * *